United States Patent [19]

Takagi et al.

[11] Patent Number: 5,018,205

[45] Date of Patent: May 21, 1991

[54] AUTOMATIC SOUND LEVEL COMPENSATOR FOR A SOUND REPRODUCTION DEVICE MOUNTED IN A VEHICLE

[75] Inventors: Kazunori Takagi; Shinichi Sato; Masahiko Ito; Hideo Yamamoto, all of Saitama, Japan

[73] Assignee: Pioneer Electronic Corporation, Tokyo, Japan

[21] Appl. No.: 552,364

[22] Filed: Jul. 11, 1990

Related U.S. Application Data

[63] Continuation of Ser. No. 263,768, Oct. 28, 1988, abandoned.

[30] Foreign Application Priority Data

Feb. 3, 1988 [JP] Japan .................. 63-23563
Feb. 5, 1988 [JP] Japan .................. 63-23959

[51] Int. Cl.$^5$ .............................................. H04B 1/00
[52] U.S. Cl. ...................................... 381/86; 381/98; 381/103; 381/57
[58] Field of Search ............... 381/102, 98, 86, 103, 381/57

[56] References Cited

U.S. PATENT DOCUMENTS

| | | | |
|---|---|---|---|
| 1,938,256 | 12/1933 | Jacobs | 381/102 |
| 2,069,853 | 2/1937 | Schade | 381/102 |
| 2,577,893 | 12/1951 | Holst et al. | 381/102 |
| 3,182,271 | 5/1965 | Aiken | 381/102 |
| 4,179,669 | 12/1979 | Dodson et al. | 330/59 |
| 4,641,344 | 2/1987 | Kasai et al. | 381/86 |
| 4,648,117 | 3/1987 | Kunungi et al. | 381/86 |
| 4,710,962 | 12/1987 | Matsui | 381/102 |
| 4,815,142 | 3/1989 | Imreh | 381/106 |
| 4,823,392 | 4/1989 | Walker | 381/106 |
| 4,864,246 | 9/1989 | Kato et al. | 381/107 |

FOREIGN PATENT DOCUMENTS

| | | |
|---|---|---|
| 375006 | 8/1984 | Austria . |
| 2231647B2 | 1/1974 | Fed. Rep. of Germany . |
| 2250725B2 | 4/1974 | Fed. Rep. of Germany . |
| 2415816B2 | 9/1975 | Fed. Rep. of Germany . |
| 2641675A1 | 3/1978 | Fed. Rep. of Germany . |
| 3321225A1 | 12/1983 | Fed. Rep. of Germany . |
| 0130613TI | 9/1985 | Fed. Rep. of Germany . |
| 60-261298 | 12/1985 | Japan .................. 381/86 |

OTHER PUBLICATIONS

European Search Report, #P38 37 538.9–Apr. 20, 1989.
Magazine Article–"Phono Technik," Frankfurter Fachverlag, 1984 Author–Peter Zastrow.

Primary Examiner—Forester W. Isen
Attorney, Agent, or Firm—Sughrue, Mion, Zinn, Macpeak & Seas

[57] ABSTRACT

In an automatic loudness compensator provided in a sound reproduction device in a vehicle, the sound level is compensated to reproduce a sound source with the high fidelity intended by the producer of the source of sound. The level of sound frequency-pressure is increased or decreased relative to a middle range of sound frequency at a sound level lower or higher than a reference sound level, respectively. The level of sound frequency-pressure is also adjusted based on the noise produced by the movement of the vehicle and on the acoustic characteristic of the passenger compartment of the vehicle.

7 Claims, 9 Drawing Sheets

AUTOMATIC SOUND LEVEL COMPENSATOR FOR A SOUND REPRODUCTION DEVICE MOUNTED IN A VEHICLE

This is a Continuation of Application No. 07/263,768 filed Oct. 28, 1988 now abandoned.

FIELD OF THE INVENTION

The present invention relates to an automatic loudness compensator, particularly to an automatic loudness compensator for a sound reproduction device mounted in a vehicle.

BACKGROUND OF THE INVENTION

FIG. 13 shows a first conventional loudness compensator disclosed in Japanese Patent Application (OPI) No. 248611/86 (the term "OPI" as used herein means an "unexamined published application"). The compensator comprises a sound-level-controlling tapped variable resistor $VR_1$ and a CR filter circuit 1. A high-frequency sound range compensation capacitor $C_1$ is connected between the intermediate tap c and signal input terminal of the variable resistor $VR_1$. A low-frequency sound range compensation capacitor $C_2$ and a resistor $R_1$ are connected in series with each other between the intermediate tap c and other terminal b of the variable resistor $VR_1$ and connected in parallel with a low-frequency sound range compensation level-limiting resistor $R_2$.

FIG. 14 shows a second conventional loudness compensator disclosed in Japanese Patent Application (OPI) No. 223909/83. The compensator has a sound-levelcontrolling tapped variable resistor $VR_1$. A resonance circuit 2 is connected between the intermediate tap c and terminal b of the variable resistor $VR_1$.

FIG. 15 shows a third conventional loudness compensator disclosed in Japanese Patent Application (OPI) No. 223909/83. The compensator has a pair of sound-level-controlling variable resistors $VR_1$ and $VR_1'$ for two channels, and a third controlling variable resistor $VR_2$. which is operated in conjunction with the preceding variable resistors. The level of the output from a resonance circuit 2 is regulated by the third controlling variable resistor $VR_2$. The compensator also has addition circuits 3 and 3' differentially connected to the outputs of the sound-level-controlling variable resistors $VR_1$ and $VR_1$.

FIG. 16 shows a fourth conventional loudness compensator disclosed in Japanese Utility Model Application (OPI) No. 95723/85. The compensator comprises a plurality of filters 4 and 5 for dividing an audio input signal into two or more frequency range components, a logarithmic compression amplifier 6 which logarithmically compresses at least one of the outputs from the filters, and an addition circuit 8 which adds the output from the amplifier 6 to the other filter output processed by a flat amplifier 7.

When the slider d of the sound-level-controlling variable resistor $VR_1$ of the first conventional loudness compensator is slid toward the intermediate tap c thereof between the signal input terminal a and the tap c, the sound frequency-pressure characteristic is such that the level of sound pressure is heightened by an equal quantity in both a low and a high range of sound frequency. When the slider d is slid between the signal input terminal a and the tap c in such a manner that the resistance between the tap and the slider is gradually increased, the resistance between the signal input terminal and the slider is gradually decreased so that the diagrammatic curve of the sound frequency-pressure characteristic is made gradually flatter as shown in FIG. 17. Although the second conventional loudness compensator is similar to the first one in these respects, the diagrammatic curve of the sound frequency-pressure characteristic has a larger slope due to the resonance circuit 2 and is shorter in the entire range of sound frequency, as shown in FIG. 18. When the sliders d and d' of the sound level controlling variable resistors $VR_1$ and $VR_1'$ of the third conventional loudness compensator are slid toward the signal input terminals a and a' of the resistors so that the sound levels are heightened, the slider g of the second controlling variable resistor $VR_2$ which is operated in conjunction with the preceding variable resistors is slid to the terminal f of the resistor $VR_2$ so that the level of the output from the resonance circuit 2 is gradually lowered as shown in FIG. 19. In the fourth conventional loudness compensator, the frequency range component output from the filter 4 is linear to the audio input signal, and the frequency range component output from the other filter 5 is logarithmically compressed and then added to the output from the preceding filter, so that the diagrammatic curve of the sound frequency-pressure characteristic is made gradually flatter as shown in FIG. 20.

The drawback of the first and the second conventional loudness compensators including the sound level controlling tapped variable resistors is that the sound frequency-pressure characteristic is such that the level of sound pressure is heightened by an equal quantity in the lower and the higher ranges of sound frequency relative to that of the sound pressure in the middle range of sound frequency as shown in FIG. 17, when the sound level is not higher than a value corresponding to the position of the tap of the variable resistor (that position is usually at an angle of 120° in the case where the maximum rotative angle of the variable resistor is 300°). Particularly in the first conventional loudness compensator having the CR filter circuit 1, the slope of the diagrammatic curve of the sound frequency-pressure characteristic is 6 dB/oct and there is a pressure level fluctuation in the frequency range of 200 Hz or more so that the compensator has the particular disadvantage that the sound compensated through the compensator is unclear or the middle-frequency sound through the compensator is weak.

As for the third conventional loudness compensator having the second controlling variable resistor $VR_2$. the quantity of the increase in the loudness in the low-frequency sound and/or the high-frequency sound can be gradually changed for adjustment by the second controlling variable resistor. For that reason, the compensator does not have the above-mentioned drawback and disadvantage. However, a drawback is that the compensator needs three or four mutually-coupled variable resistors, so that the spatial efficiency thereof is lower and the rotation thereof does not feel good.

As for the fourth conventional loudness compensator, the diagrammatic curve of the sound frequency-pressure characteristic is similar to an equal-sensation curve (which is a Fletcher-Manson equal-loudness curve) at a low sound level. For that reason, a drawback is that the quantity of compensation by the compensator is excessive for listening to the reproduced sound from a music source on the market or from the like, and the quality of the sound is therefore unnatural. In the process of production of the music source on the market, sounds are usually subjected to multiple-track recording through multiple microphones, quality adjusted by an effect producing device or the like. and mixed-down into a two-channel stereo format. At that time, a person listens to the recorded sounds at a certain level through a monitoring reproduction device in a studio. The sound level is usually as high as about 100 phons. The customer purchases the music source to listen to the sounds through his sound reproduction device. If the customer listens to the sounds at nearly the same sound level as the other person listens to them through the monitoring reproduction device in the studio, the customer obtains nearly the same acoustic quality as the other person does, under ideal conditions (in reality, the acoustic quality depends on the sound level characteristics of the ears, the acoustic characteristics of the room and the properties of the sound reproduction device). Although the loudness of the reproduced sounds is usually much lower than 100 phons, the sound level is higher than 100 phons in some cases and is, for example, 120 phons.

FIG. 3 shows Robinson-Datson curves which are equal-sensation curves at the sound levels of pure sounds. It is understood from FIG. 3 that the form of the Robinson-Datson curve at the sound level of 100 phons is different from that of the curve at the sound level of 120 phons. In other words, the rise in the level of sound pressure in a low range of frequency or the fall in the sensitivity of the ear to the level of sound pressure in the range is relatively steep at the sound level of 100 phons but relatively low at the sound level of 120 phons. This means that the quality of a sound reproduced at a high sound level is not equal to that of the sound monitored by a person at the time of recording of the sound. In other words, the level of the pressure of the reproduced sound in a low range of sound frequency or a high range of sound frequency feels higher at the high sound level. Therefore, the quality of the reproduced sound at the high sound level is different from that of the reproduced sound at a low level.

FIG. 4 shows the differences between the equal-sensation curve at the reference sound level of 100 phons and the other equal-sensation curves at other levels. It is understood from FIG. 4 that the level of sound pressure rises or the sensitivity of the ear thereto falls in the low-frequency sound range of 200 Hz and less and the middle-frequency and high-frequency sound ranges from 1.5 kHz to 10 kHz as the sound level falls, and that the level of sound pressure falls or the sensitivity of the ear thereto rises in the sound ranges as the sound level rises. For that reason, the differences need to be compensated if the quality of the reproduced sound is to be nearly equal to that of the sound monitored by the person at the time of the recording of the sound.

Each of the conventional loudness compensators including the sound level controlling tapped variable resistors function so that the diagrammatic curve of the sound frequency-pressure characteristic is made flat when the variable resistor is set for the highest sound level. For that reason, a drawback of the compensators is that the compensation becomes ineffective when listening to the sounds of the music source on the market or to the like, at a high sound level which makes the quality of the sounds unnatural.

All of the four conventional loudness compensators have drawbacks in that they do not perform compensation at a sound level higher than that of the reference equal-sensation curve or compensate for masking based on the noise produced by a moving vehicle equipped with a sound reproduction device provided with the loudness compensator.

SUMMARY OF THE INVENTION

It is an object of the present invention to eliminate the above-mentioned drawbacks and disadvantages of the conventional loudness compensators.

Accordingly, the present invention provides an automatic loudness compensator for a sound reproduction device mounted in a vehicle, wherein the compensator performs optimal compensation in terms of sound level to reproduce the sounds of a sound source with the high fidelity intended by the producer of the source of sound. In the compensator, a compensation circuit is provided so that a quantity of compensation, which is nearly equal to the difference between a reference equal-sensation curve at a prescribed sound level and each of other equal-sensation curves at other sound levels, is set by the compensation circuit to automatically compensate the sound frequency-pressure characteristics at the other sound levels. Another quantity of compensation is also set by the compensation circuit against masking based on the noises produced in moving the vehicle at the time of movement thereof. The level of sound pressure in a low or high range of sound frequency is increased relative to that of sound pressure in a middle range of sound frequency at a sound level lower than the prescribed sound level, and is lowered relative to that of sound pressure in the middle range of sound frequency at a sound level higher than the prescribed sound level. The level of sound pressure in the low and the high ranges of sound frequency can thus be changed along the reference equal-sensation curve corresponding to the prescribed sound level, to always obtain the same natural quality of sound at the mutually different levels of sound, even in the passenger compartment of the vehicle, with the high fidelity intended by the producer of the source of sound.

It is another object of the present invention to provide an automatic loudness compensator for a sound reproduction device mounted in a vehicle. The compensator performs optimal compensation in terms of sound level to reproduce the sounds of a sound source with the high fidelity intended by the producer of the sound source. In the compensator, a sound level controlling variable resistor having an intermediate tap is provided so that the sound frequency-pressure characteristic is automatically compensated in terms of a sound level controlled by the variable resistor. In the automatic loudness compensator, a compensation circuit is provided so that the level of sound pressure in a low range of sound frequency and/or a high range of sound frequency is increased relative to that of sound pressure in a middle range of sound frequency at a sound level lower than a reference level, and is lowered relative to that of sound pressure in the middle range of sound frequency at a sound level higher than the reference level. As a result, the same natural quality of sound is obtained at the mutually different levels of sound, even in the passenger compartment of the vehicle, with the high fidelity intended by the producer of the source of sound.

DETAILED DESCRIPTION OF THE PREFERRED EMBODIMENTS

Figure 1:
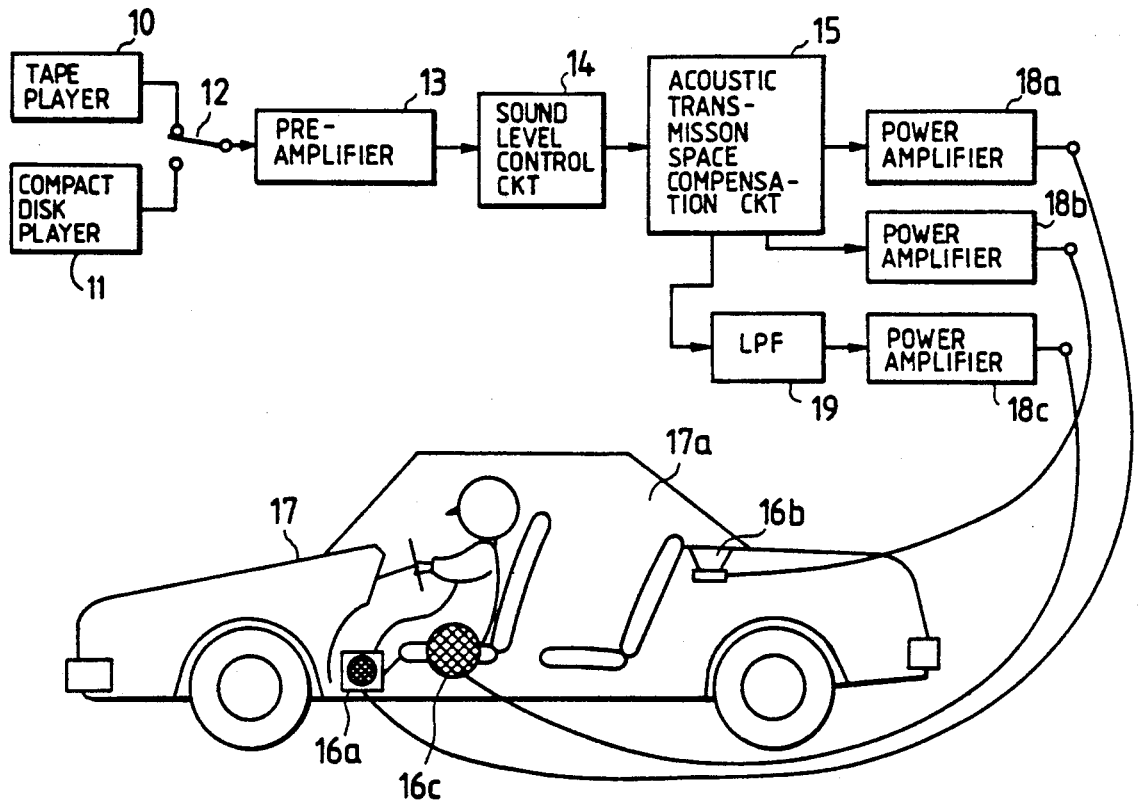
FIG. 1 shows a block diagram of a sound reproduction device mounted in a vehicle and equipped with an automatic loudness compensator which is an embodiment of the present invention.

Embodiments of the present invention are hereafter described in detail with reference to the drawings attached hereto. The same symbols in the drawings denote mutually corresponding portions.

FIG. 1 shows a block diagram of a sound reproduction device mounted in a vehicle and equipped with an automatic loudness compensator which is one of the embodiments. A tape player 10 or compact disk player 11 reproduces a sound by sending out a reproduced audio signal and supplies it to a preamplifier 13 through a switch 12. The preamplifier processes the signal and produces an output which is subjected to loudness control by a sound level control circuit 14 and then subjected to acoustic transmission space compensation. Acoustic transmission space compensation circuit 15 cooperates with the loudness compensation circuit in setting a sound level as a reference level of sound pressure to provide a desired acoustic transmission characteristic. The output from the acoustic transmission space compensation circuit 15 is supplied to power amplifiers 18a, 18b and 18c corresponding to loudspeakers 16a, 16b and 16c, respectively, which are disposed in prescribed positions in the passenger compartment 17a of the vehicle 17. Since the loudspeaker 16c is for sounds of very low frequency a low-pass filter (LPF) 19 is connected between the acoustic transmission space compensation circuit 15 and the power amplifier 18c.

Figure 2:
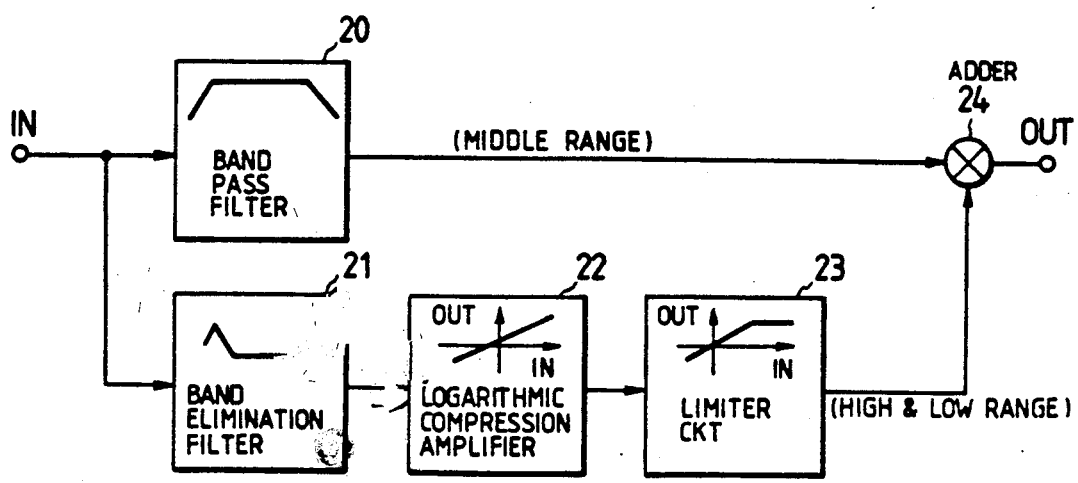
FIG. 2 shows a block diagram of an automatic loudness compensator.

FIG. 2 shows the automatic loudness compensator which is a part of the sound level control circuit 14. The audio input signal to the compensator is supplied to the band pass filter 20 and band elimination filter 21. The band pass filter 20 allows the middle-frequency sound range component of the signal to pass through and the band elimination filter 21 (including two resonance circuits); allows the low-frequency and high-frequency sound range components of the signal to pass through and then be amplified. The center frequency $f_1$, reproduction level $A_1$ and reproduction frequency band $\Delta f_1$ of the low-frequency sound range resonance circuit of the band eliminantion filter 21 and the center frequency $f_2$, reproduction level $A_2$ and reproduction frequency band $\Delta f_2$ 2 of the high-frequency sound range resonance circuit of the band elimination filter are preset as follows: $20 < f_1 \leq 100$ (Hz). $2 < f_2 \leq 10$ (kHz). $A_1 \leq A_2$, $\Delta f_1 \leq 200$ (Hz) and $\Delta f_2 \geq 1$ (kHz). The low-frequency and the high-frequency sound range components extracted and amplified by the band elimination filter 21 are logarithmically compressed by a logarithmic compression amplifier 22 and then subjected to output limitation above a voltage by a limiter circuit 23 for a desired sound level. The low-frequency and the high-frequency sound range components processed through the limiter circuit 23 are added, by an adder 24, to the middle-frequency sound range component extracted by the band pass filter 20 so that an audio output signal is output from the adder.

Figure 3:
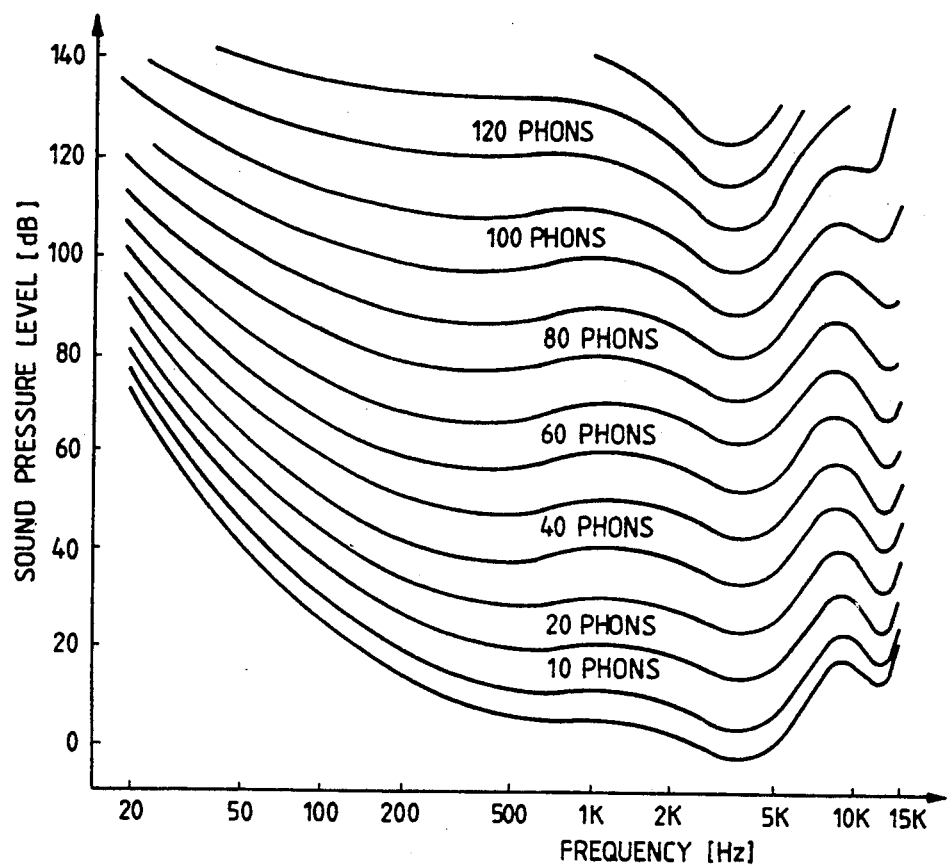
FIG. 3 shows Robinson-Datson equal-loudness curves which are equal-sensation curves.
Figure 4:
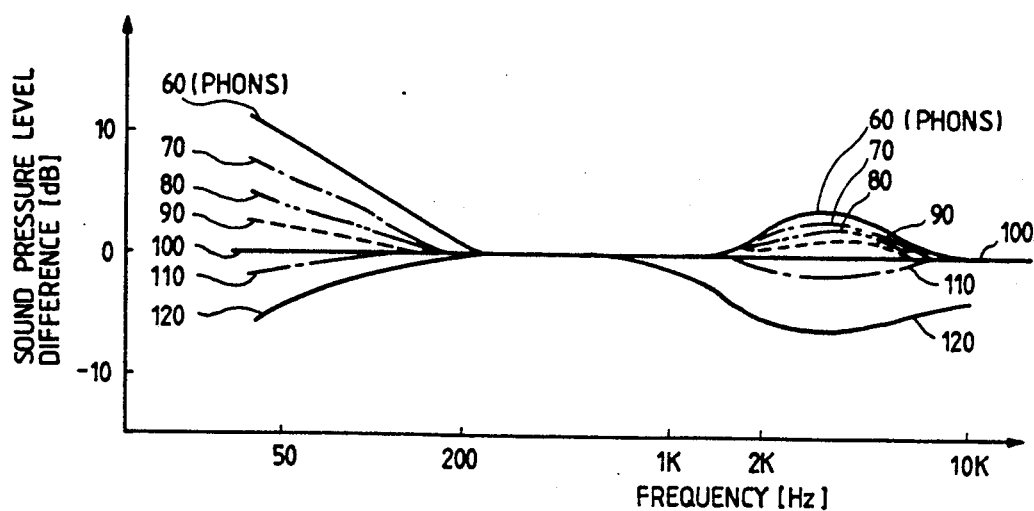
FIG. 4 shows graphs of the differences between a reference equal-sensation curve and the other equal-sensation curves.

As mentioned above. FIG. 4 shows the differences between the reference equal-sensation curve shown in FIG. 3 corresponding to a sound level of 100 phons and other equal-sensation curves shown therein and corresponding to other sound levels. The differences need to be compensated if sounds of the same quality as those which are heard by a person listening through a monitor when the sounds are being recorded are to be reproduced. For compensation of the differences, the band pass filter 20 for extracting the middle-frequency sound range component is provided. The band pass filter 20 is needed for the purpose of compensating the differences between the reference equal-sensation curve and the other equal-sensation curves at a sound level of less than 100 phons. Also, the band pass filter 20 compensates the differences between the reference equal-sensation curve and the other equal-sensation curves at sound levels of more than 100 phons to obtain a sound frequency-pressure characteristic so that the level of sound pressure in a low and a high range of sound frequency is lowered relative to that of sound pressure in a middle range of sound frequency.

Figure 5:
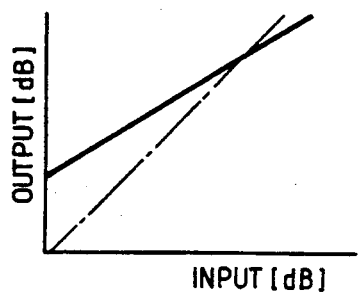
FIG. 5 shows the input-output characteristic of the logarithmic compression amplifier of the automatic loudness compensator shown in FIG. 2.

The low-frequency and the high-frequency sound range components extracted and amplified to desired frequency characteristics by the band elimination filter 21 are logarithmically compressed by the logarithmic compression amplifier 22 so that the levels of the components are set relative to that of the middle-frequency sound range component. Shown by a one-dot chain line in FIG. 5 is the linear input-output characteristic of the logarithmic compression amplifier 22 for the middle-frequency sound range component. Shown by a full line in FIG. 5 is the other linear input-output characteristic of the amplifier 22 for the low-frequency and the high-frequency sound range components. The diagrammatic line of the latter characteristic of the amplifier 22 has a smaller slope than that of the former characteristic thereof. For that reason, the ratio of the middle-frequency sound range component to the low-frequency and the high-frequency sound range components can be gradually changed by the logarithmic compression amplifier 22.

Figure 6:
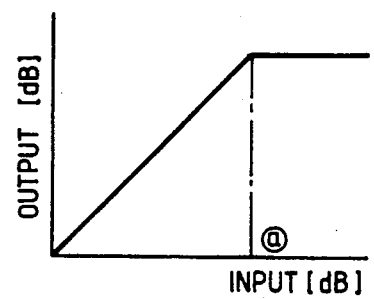
FIG. 6 shows the input-output characteristic of the limiter circuit of the automatic loudness compensator shown in FIG. 2.

The limiter circuit 23 is provided to damp the low-frequency and the high-frequency sound range components at a sound level of more than 100 phons. FIG. 6 shows the input-output characteristic of the limiter circuit 23. A point a shown in FIG. 6 corresponds to the sound level for the reference equal-sensation curve. The input levels of the high-frequency and the low-frequency sound range components, which are higher than the point a, are limited by the limiter circuit 23 as shown in FIG. 6.

Figure 7:
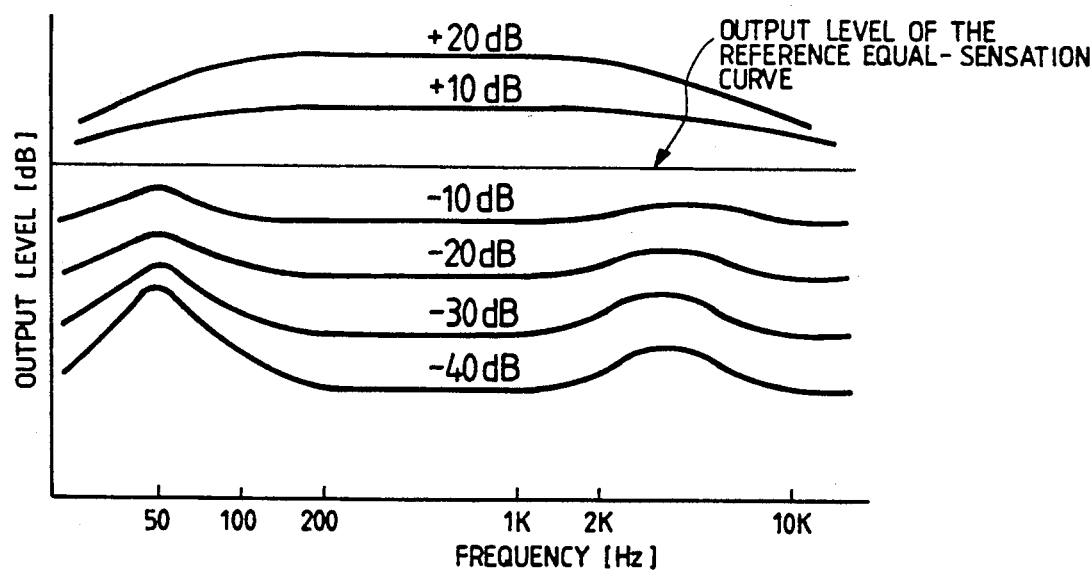
FIG. 7 shows sound frequency-pressure characteristics compensated by the automatic loudness compensator in terms of sound level but not of masking.

FIG. 7 shows desired sound frequency-pressure characteristics achieved by the action of the above-described sections of the automatic loudness compensator.

Figure 8:
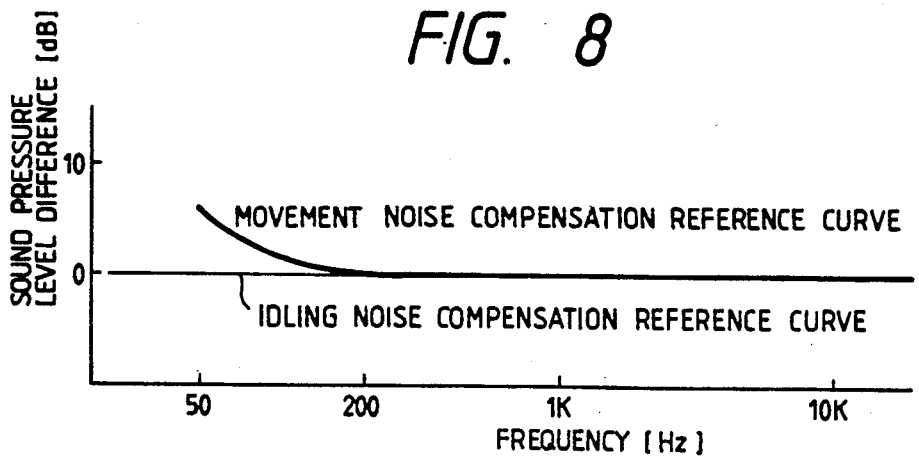
FIG. 8 shows noise compensation curves at the sound level for the reference equal-sensation curve to indicate the difference in the level of sound pressure between the noise compensation curves.
Figure 9:
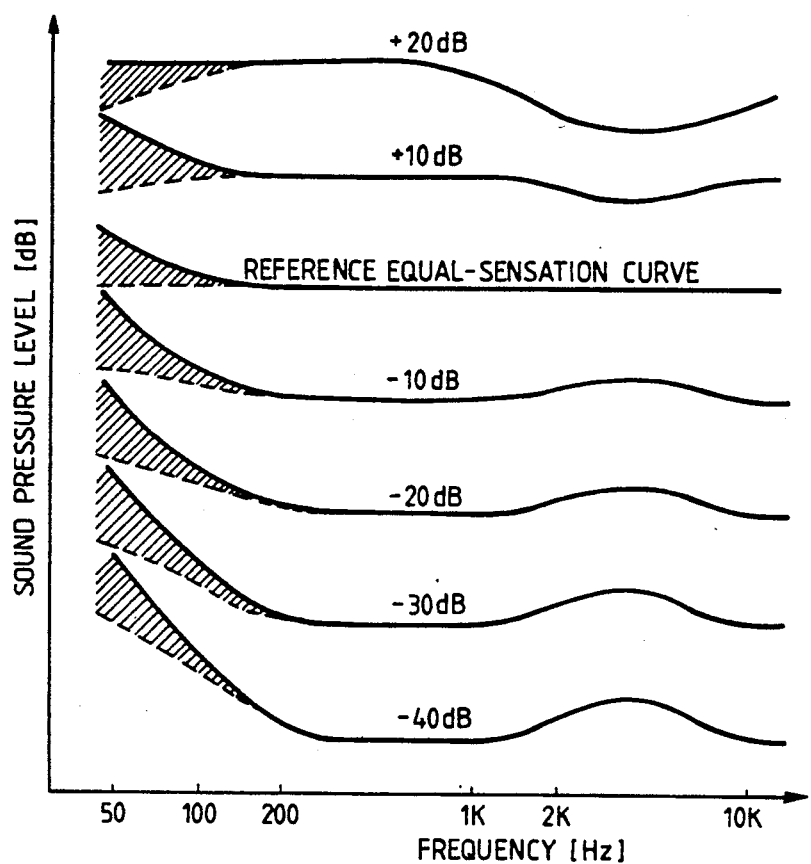
FIG. 9 shows sound frequency-pressure characteristics compensated by the automatic loudness compensator in terms of both sound level and masking.

The equal-sensation curve of both the sounds reproduced by the sound reproduction device and the noise produced in moving the vehicle 17 differs from the equal-sensation curve of pure sounds. Since masking is caused on the sound reproduction device by the noise produced in moving the vehicle, the masking also needs to be compensated. Although the level of the movement noise and the level of the sound source need to be compared with each other if the masking is to be accurately compensated, the masking is compensated in terms of the difference between the sound pressure level of about 45 dB (A) when an ordinary passenger car is idle the sound pressure level of about 70 dB (A) when the car is travelling 100 km/hr in this embodiment. FIG. 8 shows the difference in the sound pressure level between an idling noise compensation reference curve shown by a one-dot chain line in the drawing and corresponding to the sound level of the above-mentioned reference equal-sensation curve and a 100 km/hr movement noise compensation reference curve shown by a full line in the drawing and corresponding to the reference equal-sensation curve. This sound level difference is additionally preset as a masking compensation quantity in the automatic loudness compensator shown in FIG. 2. The masking compensation quantity is limited within hatched regions shown in FIG. 9 indicating the loudness compensation characteristics, to compensate for the masking caused by the noise produced in moving the vehicle 17, to produce a high quality of reproduced sounds with the high fidelity intended by the producer of the source of sound.

Figure 10:
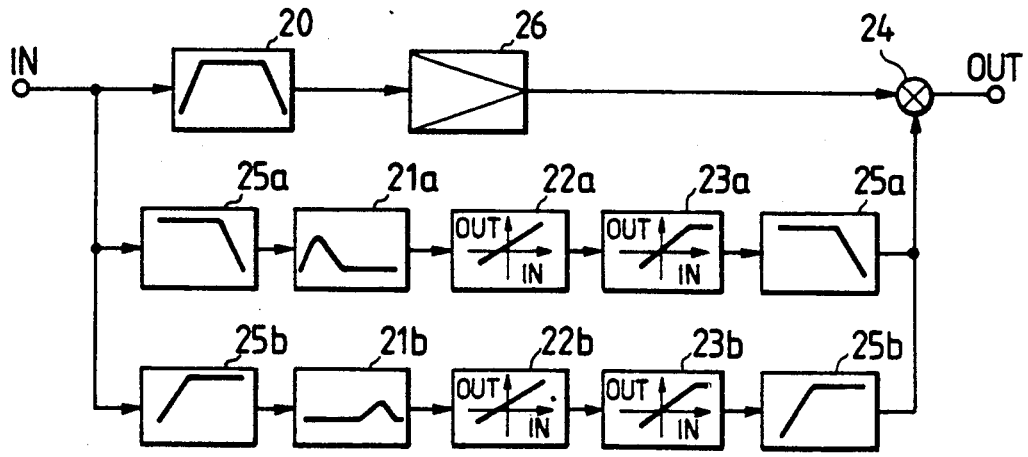
FIGS. 10, 11 and 12 show block diagrams of automatic loudness compensators which are other embodiments of the present invention.

Although the frequency band of the audio input signal is divided into two sections, one of which is for the middle range of sound frequency and the other of which is for the low and the high ranges of sound frequency in the above-described embodiment, the present invention is not confined thereto but may be otherwise embodied so that a low-pass filter 25a and a high-pass filter 25b are provided, as shown in FIG. 10, to divide the frequency band of an audio input signal into three sections, one of which is used for the middle range of sound frequency, another one of which is for the low range of sound frequency and yet another one of which is for the high range of sound frequency. In this embodiment, the levels of the outputs from logarithmic amplifiers 22a and 22b and those of the outputs from limiter circuits 23a and 23b can be optionally set. Reference numeral 26 shown in FIG. 10 is a flat amplifier.

Figure 11:
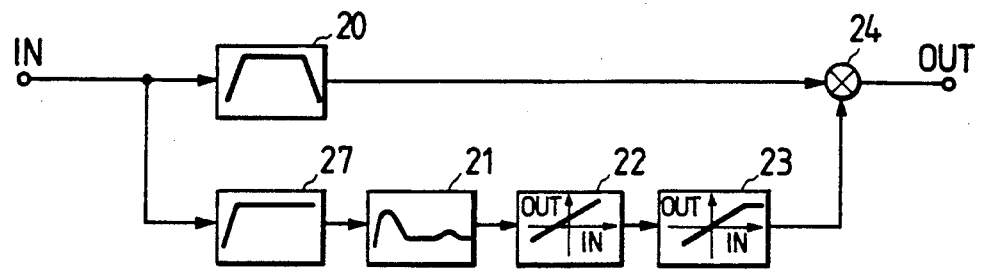

Because of the small diameter of each loudspeaker of the sound reproduction device, sounds of very low frequency are likely to be amplified by the low-frequency sound range resonance circuit of the band elimination filter 21 of the automatic loudness compensator shown in FIG. 2, below the lowest resonance frequency $f_O$ of the loudspeaker, so that harm is done to the device. In order to prevent this harm, a high-pass filter 27 may be connected to the input side of the band elimination filter 21, as shown in FIG. 11, to damp a frequency range of sounds harmful to the proper operation of the sound reproduction device.

Figure 12:
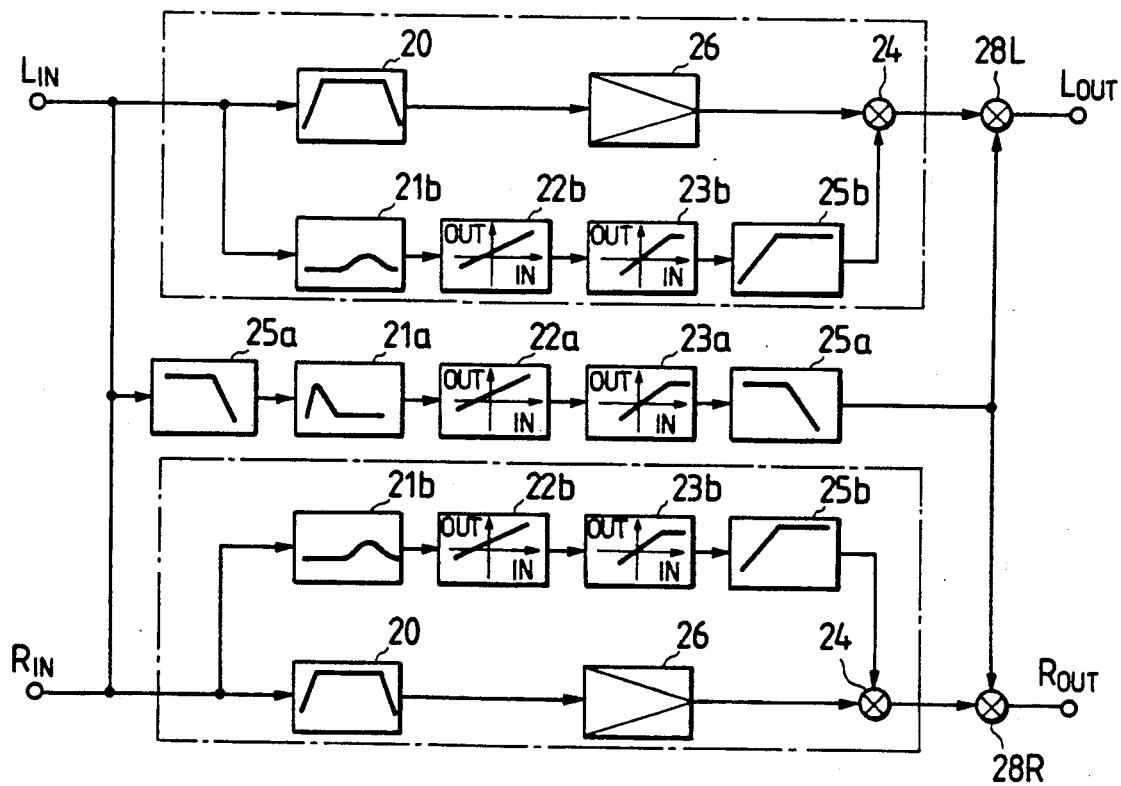
Figure 13:
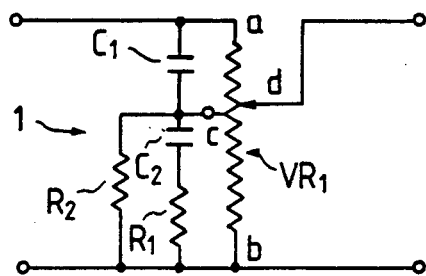
FIGS. 13, 14, 15 and 16 show diagrams of conventional loudness compensators.
Figure 14:
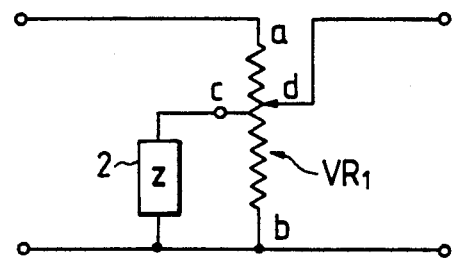
Figure 15:
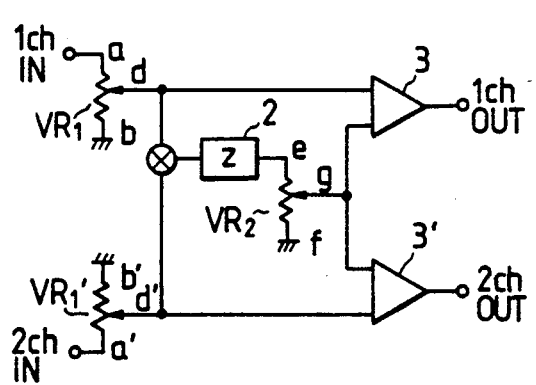
Figure 16:
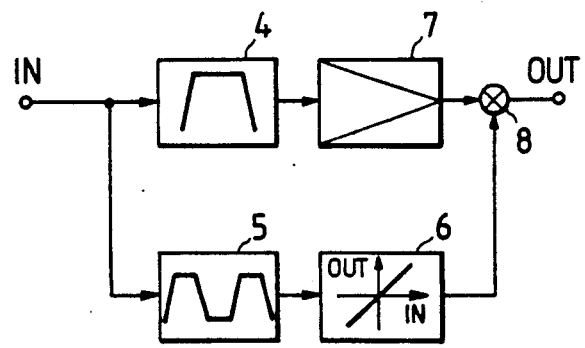
Figure 18:
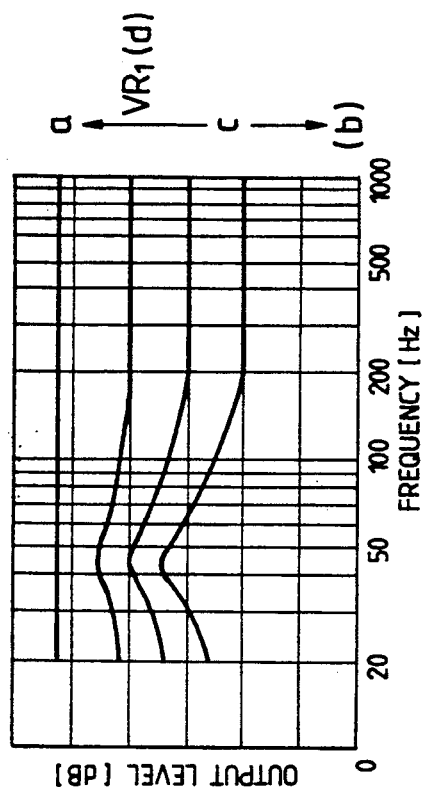
FIGS. 17, 18, 19 and 20 show sound frequency-pressure characteristics compensated by the conventional loudness compensators, respectively.
Figure 17:
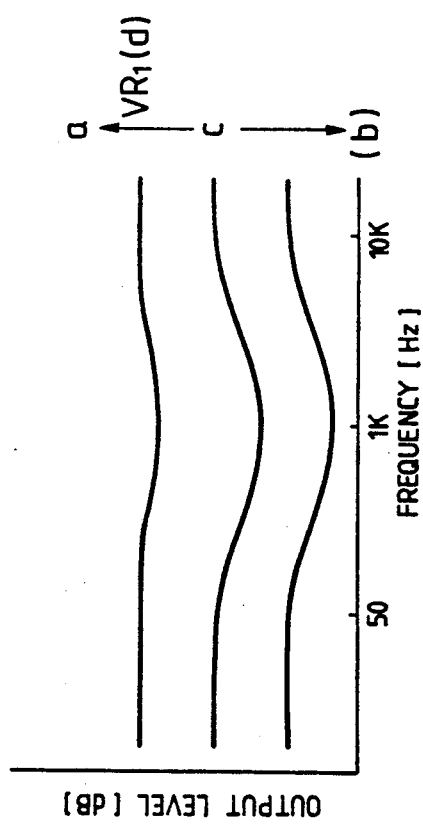
Figure 20:
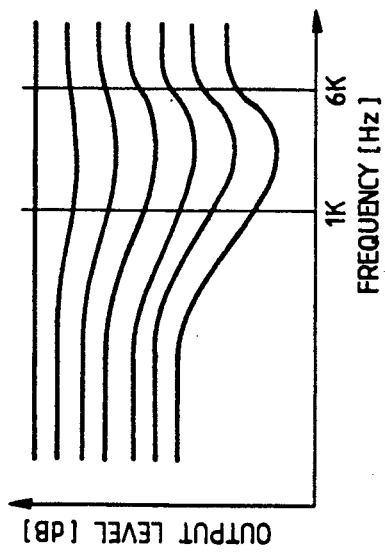
Figure 19:
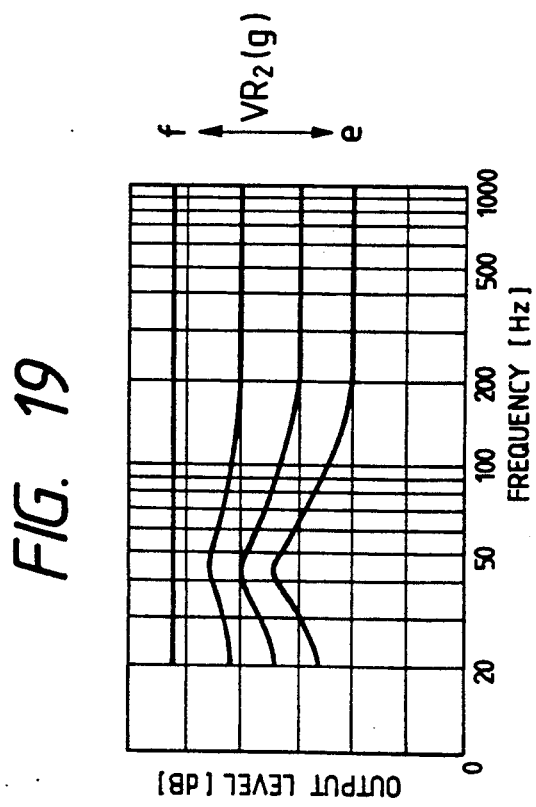

FIG. 12 shows an automatic loudness compensator which is yet another embodiment and is for a two-channel sound reproduction device mounted in a vehicle. One compensation line of the compensator is jointly used for the low-frequency sound range components of audio input signals in a right and a left channel, while the other compensation lines of the compensator are used for the other components of the audio input signals respectively. The low-frequency sound range components processed by the former compensation line are added, by adders 28R and 28L for mixing, to the other components processed by the latter compensation lines. This results in simplifying the circuit configuration of the automatic loudness compensator. Limiter circuits 23b may or may not be provided in this embodiment.

Figure 21:
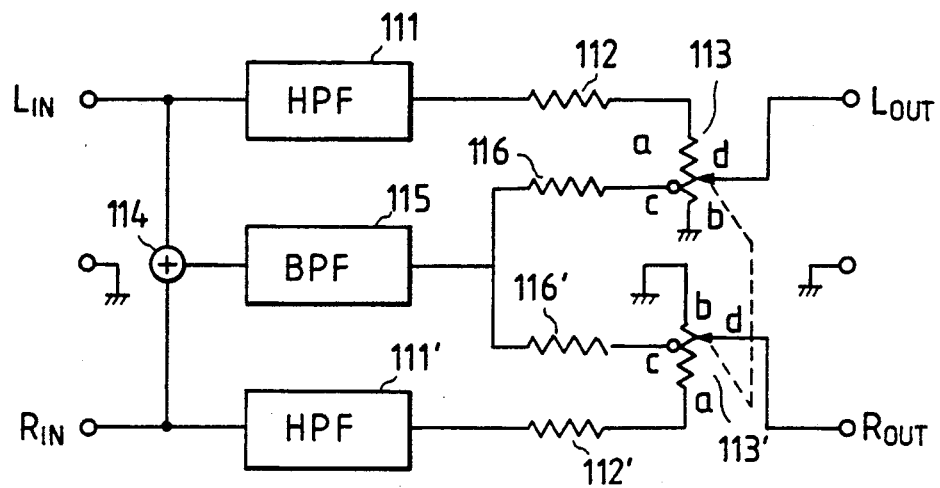
FIG. 21 shows a circuit diagram of an automatic loudness compensator which is yet another embodiment of the present invention.

FIG. 21 shows an automatic sound compensator which is yet another embodiment and is for a sound reproduction device mounted in a vehicle. Shown as Rin, Lin, Rout and Lout in FIG. 21 are an input terminal for a right channel, an input terminal for a left channel, an output terminal for the right channel and an output terminal for the left channel, respectively. Stereo-channel signals supplied to the input terminals Rin and Lin are entered into high-pass filters 111 and 111', respectively, and into the two input terminals of an adder 114. The middle-frequency and high-frequency sound range components of the stereo-channel signals are extracted by the high-pass filters 111 and 111' and supplied to the input terminals a and a' of sound level controlling variable resistors 113 and 113' through level control resistors 112 and 112', respectively. The sliders d of the variable resistors 113 and 113' are operated in conjunction with each other. The adder 114 adds the stereo-channel signals to each other. The output from the adder 114 is supplied to a band pass filter 115 for extracting the low-frequency sound range component of the output of the adder. The low-frequency sound range component is supplied to the intermediate taps of the sound level controlling variable resistors 113 and 113' through level control resistors 116 and 116', respectively. Sound level compensated signals are sent out from the output terminals Lout and Rout connected to the sliders d of the sound level controlling variable resistors 113 and 113', respectively.

The gradient and cutoff frequency $f_{CI}$ of the high-pass filters 111 and 111' are 12 dB/oct, and about 300 Hz to about 500 Hz, respectively. The adder 114 combines the stereo-channel signals to form a single signal. The gradient and cutoff frequency $f_{CZ1}$ of the band pass filter 115 are −12 dB/oct. and about 70 Hz to about 150 Hz. respectively. The gradient of the band pass filter 115 may be −18 dB/oct., −6 dB/oct. or the like, but should preferably be −12 dB/oct. or less to make passenger compartment acoustic transmission space compensation effective.

If the sound reproduction device equipped with the automatic loudness compensator shown in FIG. 21 has box-shaped bass loudspeakers of small diameter, the amplitude of the vibration of the loudspeakers of small diameter, the amplitude of the vibration of the loudspeakers is greatly increased below the resonance frequency of the ports thereof. The low band cutoff frequency fc22 of the band pass filter 115 effectively prevents an abnormal sound from being caused due to the great increase in amplitude of vibration of the loudspeakers or prevents an abnormal sound such as chatter and distortion from being caused by the loudspeaker in the very low range of sound frequency when the loudspeaker is embedded. The cutoff frequency fc22 and gradient of the band pass filter 115 are determined depending on the properties of the loudspeakers, to be 50 Hz and 12 dB/oct., respectively, in this embodiment.

Figure 22A:
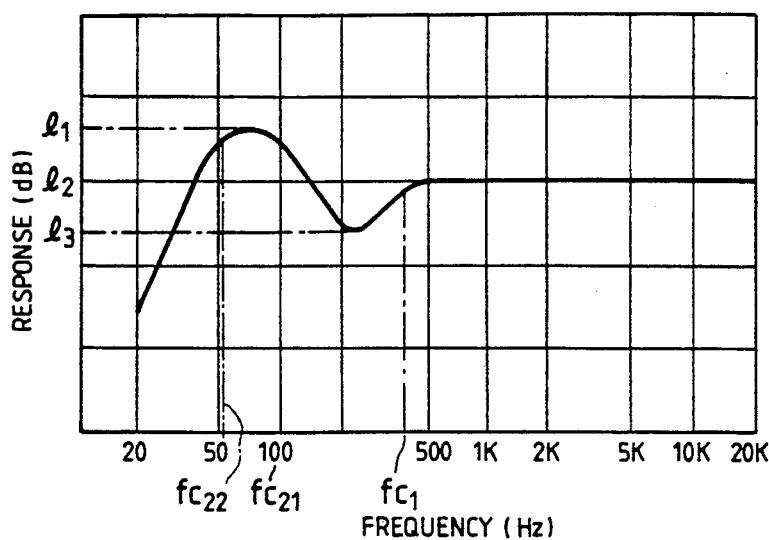
FIGS. 22A and 22B show sound frequency-pressure characteristics compensated by the automatic compensator shown in FIG. 21.
Figure 22B:
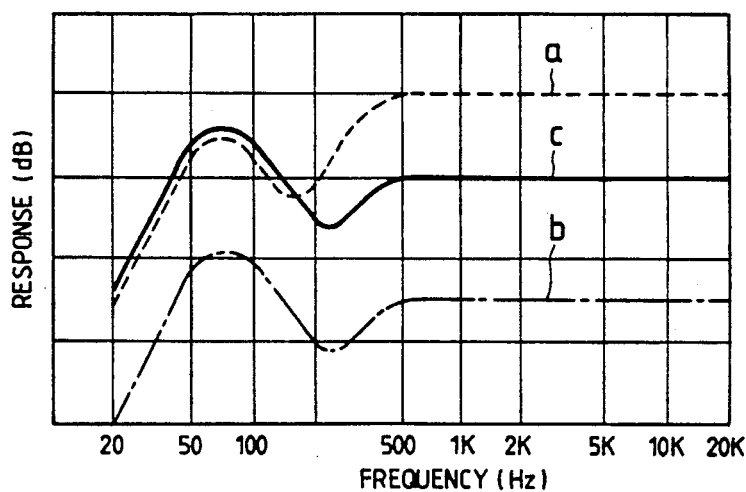

Sound frequency-pressure characteristics corresponding to the mutually different portions of the sliders d of the sound level controlling variable resistors 113 and 113′ are now described with reference to graphs shown in FIGS. 22A and 22B. When the sliders d are located on the intermediate taps c of the variable resistors 113 and 113′, the sound frequency-pressure characteristic shown in FIG. 22A is produced. The levels $l_1$ of sound pressure in the low range of sound frequency and $l_2$ of sound pressure in the middle and high ranges of sound frequency are determined by the resistances of the level control resistors 112. 112′, 116 and 116′. The frequency range (between $f_{C1}$ and fc21) of the concave portion (which is made by the high-pass filters 111 and 111′ and the band pass filter 115) of the diagrammatic curve of the sound frequency-pressure characteristic shown in FIG. 22A and the level $l_3$ of sound pressure are determined to nearly correspond to the convex portion (peak) of the diagrammatic curve of the acoustic characteristic of the passenger compartment of the vehicle. A full line c in FIG. 22B shows the sound frequency-pressure characteristic produced when the sliders d of the variable resistors 113 and 113 ′ are located on the intermediate taps thereof. When the sliders d are slid and located on the input terminals a of the variable resistors 113 and 113′. the sound frequency-pressure characteristic shown by dotted line a in FIG. 22B is produced. When the sliders d are slid from the intermediate d taps to the input terminals a, the levels of the middle-frequency and the high-frequency sound range components sent out from the high-pass filters 111 and 111′ are increased because the resistance between the slider and the input terminal is gradually decreased, but the level of the low-frequency sound range component sent out from the band pass filter 115 is not increased because the resistance between the slider and the intermediate tap is gradually increased. For that reason, the sound frequency-pressure characteristic shown by the full line c is gradually changed toward the characteristic shown by the dotted line a. When the sliders d are slid from the intermediate taps c to the grounded terminals b of the variable resistors 113 and 113′, the resistance between the slider and the intermediate tap is increased but the resistance ratio is not changed, so that the levels of the outputs from the high- pass filters 111 and 111′ and that of the output from the band pass filter 115 are dropped to produce the sound frequency-pressure characteristic shown by a one-dot chain line b in FIG. 22B and similar to the preceding sound frequency-pressure characteristics a and c. The concave portion of each of the diagrammatic curves of the sound frequency-pressure characteristics a, b and c, which is made by the actions of the high-pass filters 111 and 111′, and the band pass filter 115 around the frequency of 250 Hz, nearly corresponds to the convex portion (peak) of the diagrammatic curve of the acoustic characteristic of the passenger compartment of the vehicle, which arises around the frequency of 250 Hz. Therefore, the concave portion of each of the diagrammatic curves of the sound frequency-pressure characteristics a, b and c effectively serves to compensate the acoustic characteristic of the passenger compartment of the vehicle.

If it is unlikely that an abnormal sound will be caused in the very low range of sound frequency, the band pass filter 115 may be replaced with a low-pass filter.

Figure 23:
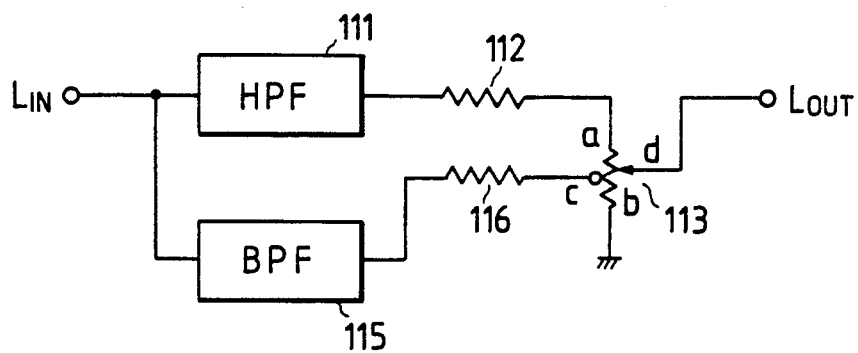
FIG. 23 shows a circuit diagram of an automatic loudness compensator which is yet another embodiment of the present invention.

Although the frequency band of each of the stereo-channel signals is divided into two sections and the low-frequency sound range components of the signals are added to each other to make a single signal to damp harmful very-low-frequency sound components in the embodiment shown in FIG. 21, the present invention is not confined thereto but may be otherwise embodied so that the low-frequency sound range components of the signals are separately processed for the right and the left channels as shown in FIG. 23, to produce the same sound frequency-pressure characteristics as those shown in FIGS. 22A and 22B.

Figure 24:
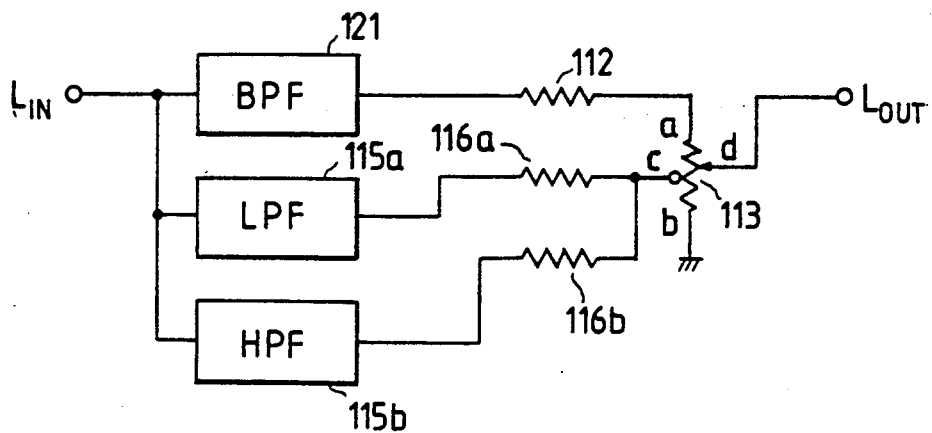
FIG. 24 shows a circuit diagram of an automatic loudness compensator which is yet another embodiment of the present invention.
Figure 25:
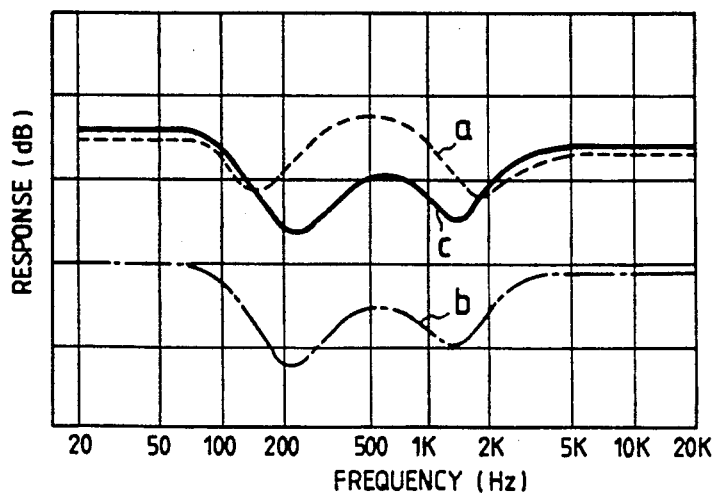
FIG. 25 shows sound frequency-pressure characteristics compensated by the automatic loudness compensator shown in FIG. 24.

Although only the low-frequency sound range components of the stereo-channel signals are damped at a sound level above a reference sound level in the embodiment shown in FIG. 21, the present invention is not confined thereto but may be otherwise embodied so that a construction as shown in FIG. 24 is provided to damp both the low-frequency sound range components and the high-frequency sound range components of stereo-channel signals at a high sound level above a reference sound level. In the embodiment shown in FIG. 24, a low-pass filter 115a and a high-pass filter 115b are provided so that the filter 115a extracts the low-frequency sound range component of the input signal and the other filter 115b extracts the high-frequency sound range component of the input signal. These components are supplied to the intermediate tap of a sound level controlling variable resistor 113 through level control resistors 116a and 116b. The low band cutoff frequency of a band pass filter 121 and the cutoff frequency of the low-pass filter 115a may be equalize to the cutoff frequency of the high-pass filter 111 and the high band cutoff frequency of the band pass filter 115, respectively. The high band cutoff frequency of the band pass filter 115 and the cutoff frequency of the high-pass filter 115b are made sufficiently different from each other and set at values which produce sound frequency-pressure characteristics, the diagrammatic curves of which have concave portions around the frequency of 1.5 kHz as shown in FIG. 25. A full line c in FIG. 25 shows the sound frequency-pressure characteristic produced when the slider d of a sound level controlling variable resistor 113 is located on the intermediate tap c thereof. A dotted line a in FIG. 25 shows the sound frequency-pressure characteristic produced when the slider d is located on the input terminal a of the variable resistor 113. A one-dot chain line b in FIG. 25 shows the sound frequency-pressure characteristic produced when the slider d is located between the tap c and the grounded terminal b of the variable resistor 113. As for the embodiment shown in FIG. 24, the audio sensation is effectively compensated at a high sound level and the acoustic characteristic of the passenger compartment of a vehicle is also compensated around the 1.5 kHz frequency convex portion of the diagrammatic curve.

In each of the above-described embodiments shown in FIGS. 21, 23 and 24, the sound level controlling tapped variable resistors and the filters are provided in combination to divide each of the right and the left stereo-channel signals into different frequency bands of components and the cutoff frequencies of the filters are made sufficiently different from each other to make the concave portion in each of the diagrammatic curves of the sound frequency-pressure characteristics. The frequency range of the concave portion is nearly equal to that of the convex portion (which is made due to the reflection or absorption of the sounds between the loudspeaker and the person listening in the passenger compartment of the vehicle) of the diagrammatic curve of the acoustic characteristic of the acoustic transmission space of the passenger compartment. The levels of the outputs from the filters are set by the level control resistors to obtain frequency characteristics to compensate the sounds in terms of the acoustic transmission space of the passenger compartment as well. The sounds are thus compensated in terms of not only the sound level but also the acoustic characteristic of the passenger compartment of the vehicle. This results in making the quality of the sounds natural.

In the above-described embodiments shown in FIGS. 21 and 23, the damping property in the low range of sound frequency or in the low and the high ranges of sound frequency at a high sound level prevents the clip sound of an amplifier, the tensile or abnormal action sound of the loudspeaker the chatter noise of the trim in the passenger compartment of the vehicle or the like, which would be harmful.

The present invention is not confined to the above-described embodiments, but may be embodied or practiced in other various ways without departing from the spirit or essential character thereof.

What is claimed is:

1. A sound reproduction device including an automatic loudness compensator for compensating a sound level of an audio signal, comprising;
    means for increasing a first level of sound pressure of said audio signal in a first range of sound frequency relative to a second level of sound pressure in a middle range of sound frequency when a sound level of said audio signal is lower than a reference sound level; and
    means for decreasing said first level of sound pressure relative to said second level of sound pressure in said middle range of sound frequency when said sound level of said audio signal is higher than said reference sound level;
    wherein said sound reproduction device is mounted in a vehicle; and
    further comprising: means for adjusting said first level of sound pressure relative to said second level of sound pressure based on a noise produced by movement of said vehicle.

2. A sound reproduction device including an automatic loudness compensator for compensating a sound level of an audio signal, comprising:
    means for increasing a first level of sound pressure of said audio signal in a first range of sound frequency relative to a second level of sound pressure in a middle range of sound frequency when a sound level of said audio signal is lower than a reference sound level; and
    means for decreasing said first level of sound pressure relative to said second level of sound pressure in said middle range of sound frequency when said sound level of said audio signal is higher than said reference sound level;
    wherein said sound reproduction device is mounted in a vehicle; and
    further comprising: means for adjusting said first level of sound pressure relative to said second level of sound pressure based on an acoustic characteristic of a passenger compartment of said vehicle.

3. A sound reproduction device including an automatic loudness compensator for compensating a sound level of an audio signal, comprising:
    means for increasing a first level of sound pressure of said audio signal in a first range of sound frequency relative to a second level of sound pressure in a middle range of sound frequency when a sound level of said audio signal is lower than a reference sound level;
    means for decreasing said first level of sound pressure relative to said second level of sound pressure in said middle range of sound frequency when said sound level of said audio signal is higher than said reference sound level;
    first filter means for extracting a middle-frequency sound range component from said audio signal;
    second filter means for extracting a low-frequency and a high-frequency sound range component from said audio signal;
    means for logarithmically compressing the output of said second filter means;
    means for limiting the level of the output of said logarithmic compressing means; and
    means for adding the output of said level limiting means to the output of said first filter.

4. An automatic loudness compensator as in claim 3, further comprising:
    a high-pass filter having an input connected to said input audio signal and an output connected to the input of said second filter means.

5. A sound reproduction device including an automatic loudness compensator for compensating a sound level of an audio signal, comprising:
    means for increasing a first level of sound pressure of said audio signal in a first range of sound frequency relative to a second level of sound pressure in a middle range of sound frequency when a sound level of said audio signal is lower than a reference sound level;
    means for decreasing said first level of sound pressure relative to said second level of sound pressure in said middle range of sound frequency when said sound level of said audio signal is higher than said reference sound level;
    first filter means for extracting a middle-frequency sound range component from said audio signal;
    second filter means for extracting a low-frequency sound range component from said audio signal;

third filter means for extracting a high-frequency sound range component from said audio signal;

first logarithmic compression means for logarithmically compressing the output of said second filter means;

second logarithmic compression means for logarithmically compressing the output of said third filter means;

first limiting means for limiting the level of the output of said first logarithmic compression means;

second limiting mans for limiting the level of the output of said second logarithmic compression means; and means for adding the outputs of said first limiting means, said second limiting means, and said first filter means 6. A sound reproduction device including an automatic loudness compensator for compensating a sound level of an audio signal, comprising;

means for increasing a first level of sound pressure of said audio signal in a first range of sound frequency relative to a second level of sound pressure in a middle range of sound frequency when a sound level of said audio signal is lower than a reference sound level;

means for decreasing said first level of sound pressure relative to said second level of sound pressure in said middle range of sound frequency when said sound level of said audio signal is higher than said reference sound level;

first filter means for extracting a middle-frequency sound range component from said audio signal in a first channel;

second filter means for extracting a high-frequency sound range component from said audio signal in said first channel;

third filter means for extracting a middle-frequency sound range component from said audio signal in a second channel;

fourth filter means for extracting a high-frequency sound range component from said audio signal in said second channel;

fifth filter means for extracting a low-frequency sound range component from a combined input signal comprising said audio signals in said first and second channels;

first logarithmic compression means for logarithmically compressing the output of said second filter means;

second logarithmic compression means for logarithmically compressing the output of said fourth filter means;

third logarithmic compression means for logarithmically compressing the output of said fifth filter means;

first limiting means for limiting the level of the output of said third logarithmic compression means;

first adding means for adding the outputs of said first filter means, said first logarithmic compression means and said first limiting means to form an audio output signal in said first channel; and second adding means for adding the outputs of said third filter means, said second logarithmic compression means, and said first limiting means to form an audio output signal in said second channel.

7. An automatic loudness compensator as in claim 6, further comprising:

second limiting means for limiting the level of the output of said first logarithmic compression means, the output of said second limiting means being provided to said first adding means in place of the output of said first logarithmic compression means; and third limiting means for limiting the level of the output of said second logarithmic compression means, the output of said third limiting means being provided to said second adding means in place of the output of said second logarithmic compression means.

* * * * *